(12) United States Patent  (10) Patent No.: US 7,518,221 B2
Gaucher et al.                (45) Date of Patent:     Apr. 14, 2009

(54) APPARATUS AND METHODS FOR PACKAGING INTEGRATED CIRCUIT CHIPS WITH ANTENNAS FORMED FROM PACKAGE LEAD WIRES

(75) Inventors: Brian P. Gaucher, Brookfield, CT (US); Duixian Liu, Scarsdale, NY (US); Ullrich R. Pfeiffer, Yorktown Heights, NY (US); Thomas M. Zwick, Kisslegg (DE)

(73) Assignee: International Business Machines Corporation, Armonk, NY (US)

( * ) Notice: Subject to any disclaimer, the term of this patent is extended or adjusted under 35 U.S.C. 154(b) by 472 days.

(21) Appl. No.: 11/340,934

(22) Filed: Jan. 26, 2006

(65) Prior Publication Data

US 2007/0170560 A1    Jul. 26, 2007

(51) Int. Cl.
     *H01L 23/495* (2006.01)
(52) U.S. Cl. ........................ 257/676; 257/672

(58) Field of Classification Search ......... 257/666–667, 257/379, 516, 528, E27.113, E27.114
See application file for complete search history.

(56) References Cited

U.S. PATENT DOCUMENTS

| 5,151,039 | A |   | 9/1992 | Murphy |
| 5,786,626 | A | * | 7/1998 | Brady et al. ................. 257/673 |
| 6,285,324 | B1 |   | 9/2001 | Korisch et al. |
| 6,518,885 | B1 |   | 2/2003 | Brady et al. |
| 6,982,879 | B1 |   | 1/2006 | Franca-Neto et al. |
| 7,095,372 | B2 | * | 8/2006 | Soler Castany et al. ..... 343/700 MS |
| 7,119,745 | B2 | * | 10/2006 | Gaucher et al. ....... 343/700 MS |

* cited by examiner

*Primary Examiner*—Leonardo Andújar
(74) *Attorney, Agent, or Firm*—F.Chau & Associates LLC

(57) ABSTRACT

Apparatus and methods are provided for integrally packaging semiconductor IC (integrated circuit) chips with antennas having one or more radiating elements and tuning elements that are formed from package lead wires that are appropriated shaped and arranged to form antenna structures for millimeter wave applications.

1 Claim, 10 Drawing Sheets

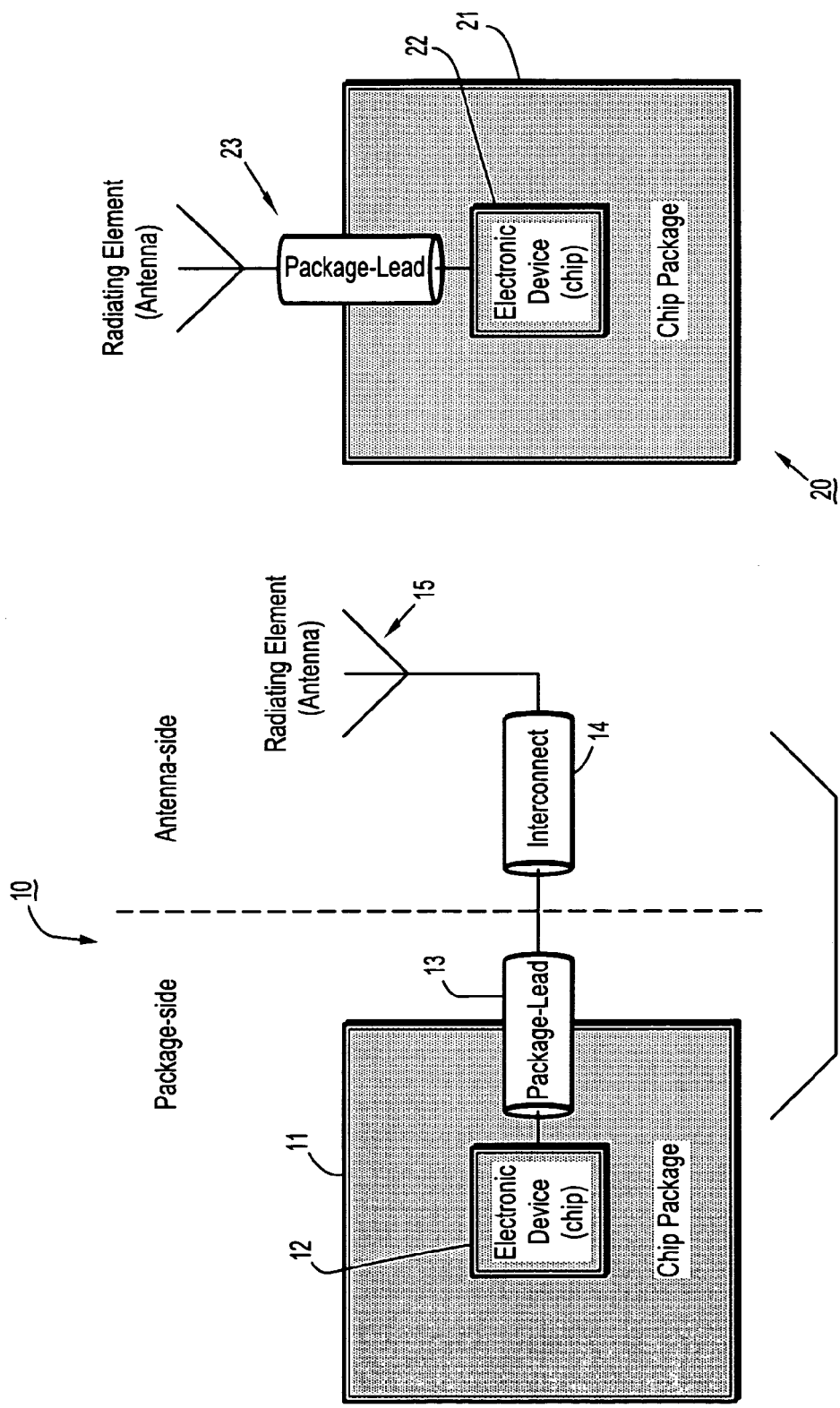

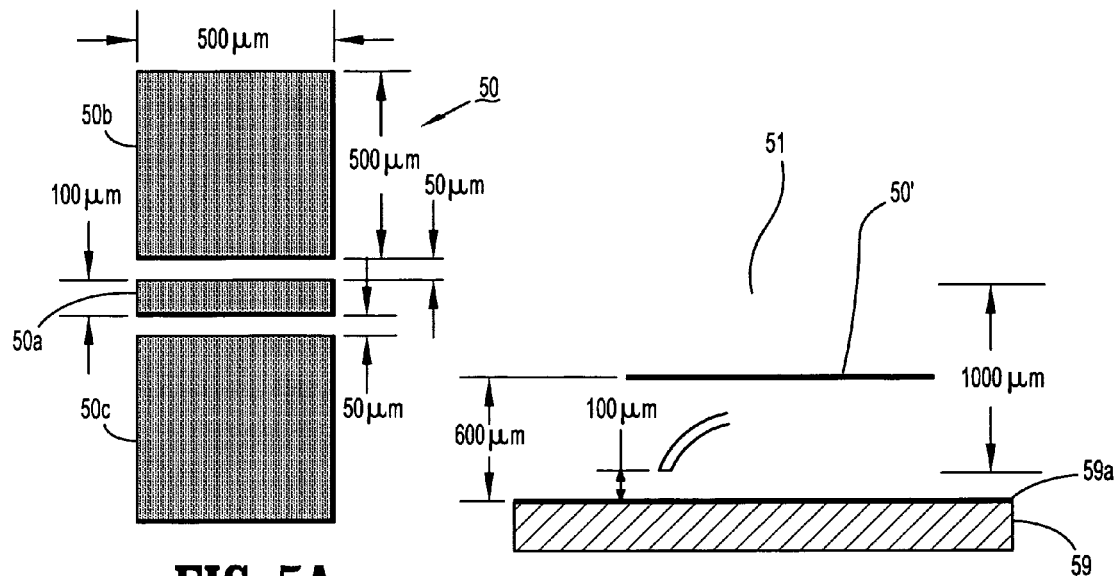
FIG. 5A
FIG. 5B
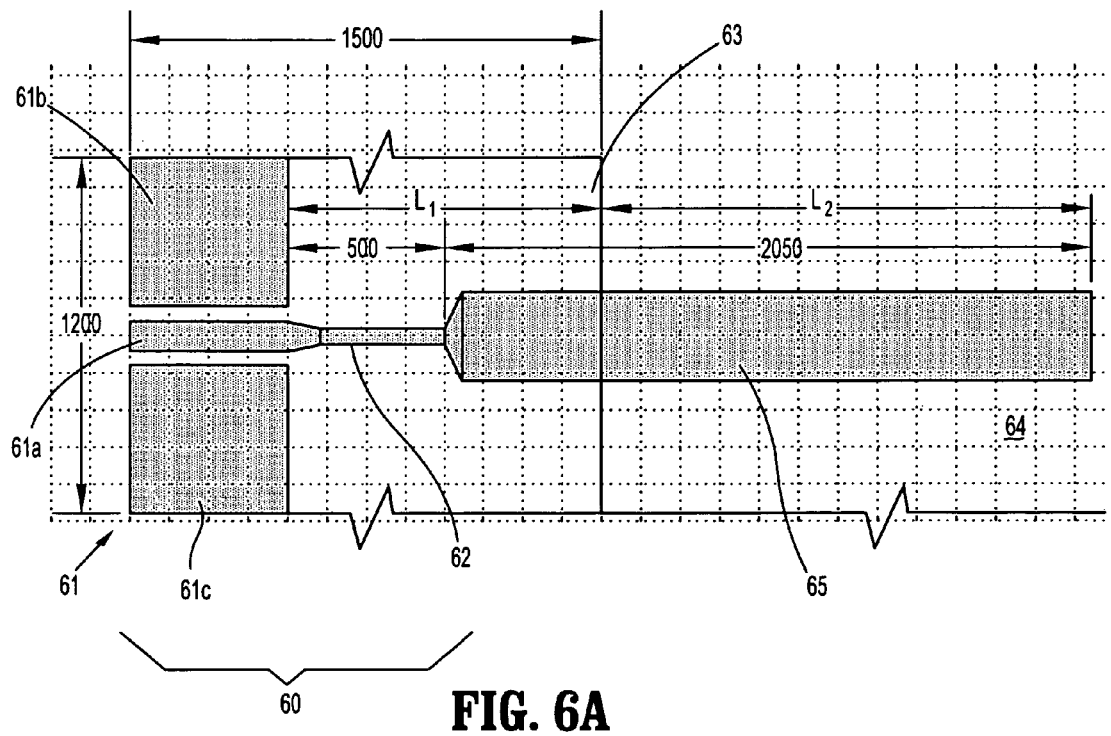
FIG. 6A

APPARATUS AND METHODS FOR PACKAGING INTEGRATED CIRCUIT CHIPS WITH ANTENNAS FORMED FROM PACKAGE LEAD WIRES

TECHNICAL FIELD OF THE INVENTION

The present invention generally relates to apparatus and methods for integrally packaging semiconductor IC (integrated circuit) chips with antenna structures that are formed using chip package lead wires, to thereby provide highly-integrated radio/wireless communications systems for millimeter wave applications.

BACKGROUND

Technological innovations in wireless systems and devices have lead to widespread development of wireless network applications for wireless PAN (personal area network), wireless LAN (local area network), wireless WAN (wide area network), cellular networks, and other types of wireless communication systems. To enable wireless communication between devices in a wireless network, the devices must be equipped with receivers, transmitters, or transceivers, as well as antennas that can efficiently radiate/receive signals transmitted to/from other devices in the network.

Conventional radio communication systems are typically constructed using discrete components that are individually encapsulated and/or mounted with low integration levels on printed circuit boards, packages or substrates. For example, FIG. 1 schematically illustrates a conventional radio communication system (10). The system (10) comprises a leaded chip package (11) with an integrated circuit chip (12) and protruding package leads (13). The package leads (13) are connected to interconnect structures (14) that are formed on a PCB (printed circuit board) or printed wiring board, for example. The interconnect structures (14) provide electrical connections to a transmitter or receiver antenna (15) (such as a printed antenna structure formed on the board level). The electrical interconnects (14) are typically built using expensive and bulky wave guides and/or package-level or board-level micro strip structures.

There is an increasing market demand, however, for more compact radio communication systems with integrated transmitter/receiver/transceiver and antenna systems, which provide high-performance, high data transmission rate, high-volume, low-power consumption, low cost, and low weight solutions. Indeed, current communication systems require high performance antenna systems that provide, e.g., wide bandwidth, high-gain, and high-efficiency operating characteristics. As the operating frequency increases, the manufacture and assembly of conventional waveguide front-ends become more difficult. In this regard, innovations in semiconductor fabrication and packaging technologies, coupled with requirements for higher operating frequencies, have made it practically feasible for integrating antennas with RF integrated circuits to provide highly integrated radio communication systems.

SUMMARY OF THE INVENTION

In general, exemplary embodiments of the invention include apparatus and methods for integrally packaging semiconductor IC (integrated circuit) chips with antennas that are formed using chip package leads as radiating elements, to thereby provide highly-integrated radio/wireless communications systems for millimeter wave applications.

In one exemplary embodiment, an electronic apparatus includes an IC (integrated circuit) chip and an antenna system, wherein the IC chip and antenna system are integrally packaged together in a leaded chip-scale package. The antenna system includes an antenna having a radiating element that is formed from a package lead wire. The radiating element may be a straight lead wire, a lead wire having at least one bend or an inverted gull wing lead wire, for example. In another exemplary embodiment, the antenna includes a tuning element formed from a package lead wire disposed in proximity to the radiating element. In yet another exemplary embodiment, the apparatus includes an integrated antenna feed network having an on-chip feed structure formed on an active surface of the IC chip and a wire bond connecting the on-chip feed structure to one end of the radiating element. The on-chip feed structure may be a CPW (coplanar waveguide which includes a center conductor wire bond connected to the radiating element of the antenna, and first and second ground elements disposed on, and spaced apart from, opposite edges of the center conductor. The antenna system my have a tuning element formed from a lead wire disposed in proximity to the radiating element, wherein the tuning element is wire bonded to one of the first and second ground elements of the CPW.

In another exemplary embodiment, the on-chip feed structure includes a balanced differential feed line including first and second coplanar feed lines, wherein the radiating element of the antenna is wire bonded to the first feed line. The antenna may further comprise a second radiating element wire bonded to the second feed line, wherein the first and second radiating element together form a balanced antenna structure such as a dipole. In another embodiment, the antenna may include a tuning element formed from a lead wire disposed in proximity to the radiating element, wherein the tuning element is wire bonded to the second feed line.

In another exemplary embodiment of the invention, a wireless communication apparatus is provided, which includes a printed circuit board, and a chip package mounted to the printed circuit board. The chip package comprises an IC (integrated circuit) chip and antenna system integrally packaged together in a leaded chip-scale package, wherein the antenna system comprises an antenna having a radiating element that is formed from a package lead wire. In another embodiment, the printed circuit board includes a metallic ground structure that functions as an antenna ground element, a radiation reflector, or both.

In various embodiments of the invention, the radiating element may be a straight, open-ended lead wire that extends substantially parallel to, and spaced apart from, a metallic ground element, or the radiating element may be a close-ended lead wire having a bent portion connected to the metallic ground element, or the radiating element may be an open-ended inverted gull wing lead wire disposed over the metallic ground element. In other exemplary embodiments of the invention, the antenna may include one or more close-ended and/or open-ended tuning elements disposed in proximity to one or more radiating elements.

These and other exemplary embodiments, aspects, objects, features and advantages of the present invention will be described or become apparent from the following detailed description of exemplary embodiments, which is to be read in connection with the accompanying drawings.

BRIEF DESCRIPTION OF THE DRAWINGS

FIG. 1 schematically illustrates a conventional radio communication system.

FIG. 2 is a high-level schematic illustration of an apparatus for integrally packaging an IC chip and antenna structure formed from one or more package lead wires, according to an exemplary embodiment of the invention.

FIGS. 5A and 5B schematically illustrate a grounded coplanar wave guide structure according to an exemplary embodiment of the invention.

FIG. 6A schematically illustrates an integrated antenna system according to an exemplary embodiment of the invention.

DETAILED DESCRIPTION OF EXEMPLARY EMBODIMENTS

Figure 3B:
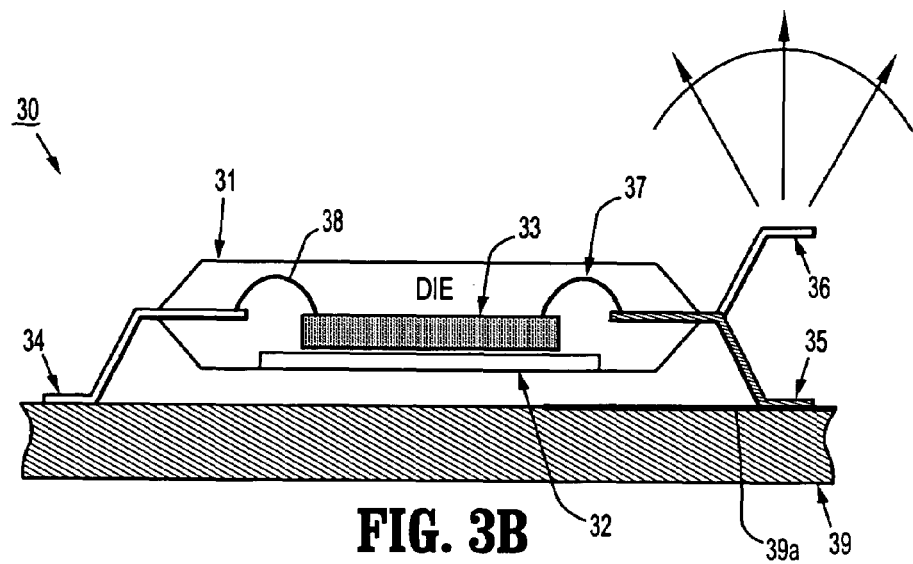
FIGS. 3A and 3B schematically illustrate an electronic package apparatus according to an exemplary embodiment of the invention, for integrally packaging an IC chip and antenna structure formed from one or more package lead wires.

FIG. 2 is a high-level schematic illustration of an apparatus for integrally packaging IC chips and antennas according to an exemplary embodiment of the invention. In particular, FIG. 2 depicts an apparatus (20) comprising a chip scale package structure (21) comprising an IC chip (22) and antenna (23) that is formed from one or more package lead wires of a lead frame of the package (21). The IC chip (22) may comprise a radio communication system-on-chip including an integrated receiver, transmitter or transceiver system, which operates at millimeter wave frequencies (e.g., 20 GHz and greater). The IC chip (22) may comprise other integrated RF active or passive devices/circuits such as antenna feeds, transmission lines, low noise amplifiers, filters, etc.

In accordance with exemplary embodiments of the invention, various types of leaded package technologies can be used to form package lead frame structures having one or more package lead wires that are sized, shaped and/or arranged to form an antenna structure. In general, leaded chip packages are typically named based on the shape of the lead wires, e.g., gull-wing leads, J-leads, C-leads, or straight I-leads. During a chip packaging process, the package lead wires are typically shaped after a package molding process. The package lead wires are initially formed as straight wires that are mechanically supported with a metal ring attached to the component body, which protects the lead wires from damage during handling. Subsequently, the ring is excised using a suitable tool and the package leads are shaped using a universal trim and form device.

It is to be appreciated that during a lead forming process, one or more lead wires can be sized, shaped and arranged to form an antenna structure having desired antenna characteristics such as resonant operating frequency, radiation efficiency, gain, operation bandwidth, etc. The lead wire(s) can be designed with a given length such that most of the lead wire(s) protrudes from, and is not covered by, lossy insulation material that is used to form the package mold (or encapsulation). Indeed, lead wires can be shaped and sized to as radiating elements which protrude from the package structure such that most of the antenna area is surrounded by air.

In other exemplary embodiments described in further detail, antenna structures with lead wire antenna elements can be designed in conjunction with board-level ground planes and/or ground connections, if necessary. In particular, depending on the application, lead wire antenna elements can be terminated on the board-level with an open or short circuit to provide required boundary conditions. A board-level ground plane can be used as a ground termination for an antenna lead wire elements, can operate as an antenna ground plane for monopole radiators, and can operate as a reflecting surface to direct radiation in a given direction.

In other exemplary embodiments of the invention described in detail below, antenna structures can be formed using one or more grounded or open-ended lead wire elements (tuning elements) that are disposed in proximity to a radiating lead wire element for purposes of tuning the antenna to achieve desired antenna properties. The lead wire tuning elements can be sized, shaped and arranged for purposes of controlling antenna impedance, increasing antenna bandwidth, control antenna radiation patterns, etc.

Figure 3A:
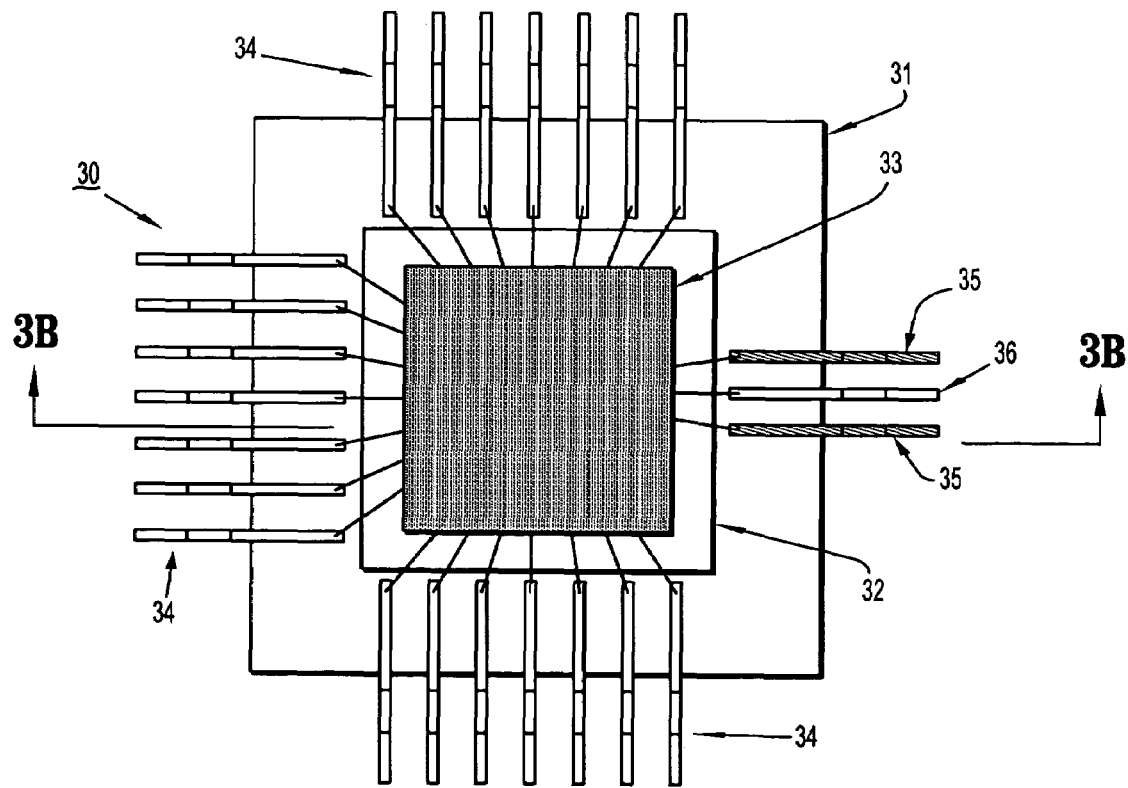

FIGS. 3A and 3B schematically illustrate an electronic package apparatus (30) according to an exemplary embodiment of the invention, for integrally packaging an IC chip and antenna structure formed from one or more package lead wires. FIG. 3A is a top plan view of the apparatus (30) and FIG. 3B is a side-view of the apparatus (30) along line 3B-3B in FIG. 3A. The apparatus (30) comprises a package mold (31) (or package encapsulation), a carrier substrate (32) (or package frame structure), an IC chip (33), a plurality of package lead wires (34), (35), (36), and wire bond connections (37, (38). The electronic package (30) is depicted as being mounted to a PCB (printed circuit board) (39) having a metallic ground plane (39a) on a surface thereof. The metallic ground plane (39a) can serve as an antenna ground plane and/or radiation reflector.

The carrier substrate (32) and lead wires (34), (35) and (36) are part of a metallic lead frame structure that is formed using known techniques (e.g., etching, stamping). The die paddle (32) serves to mechanically support the IC chip (33) during package manufacture. The IC chip (33) is backside mounted to the substrate (32) during a die mounting process using known techniques. The IC chip (33) (or die) may comprise an integrated radio communications system (e.g., receiver, transmitter, transceiver, etc.). The lead wires (34), (35) and (36) are connected to appropriate bond pads on the active surface of the chip (33) by wire bonds (37) and (38) during a wire bonding process. The lead wires (34) provide I/O connections and power supply connections between external wiring/pads on the PCB (39) and BEOL (Back-end-of-line) pads/wiring on the active surface of the IC chip (33).

Further, in the exemplary embodiment of FIGS. 3A and 3B, the package lead wire (36) is formed to operate as a radiating element of an antenna structure. The package lead wire (36) is shaped as an inverted gull-wing lead, although this is merely exemplary and other lead wire shapes are possible to form antenna radiating elements. In other exemplary embodiments of the invention, a plurality of lead wires can be formed as radiating elements to construct various types of antenna structures including, for example, antenna arrays or multi-band antennas, etc.

As noted above, antenna structures according to exemplary embodiments of the invention can be formed using one or more grounded or open ended lead wire elements that are disposed in proximity to a radiating lead wire element for purposes of tuning the antenna to achieve desired antenna properties. For example, in the exemplary embodiment of FIGS. 3A/3B, the lead wires (35) may be used as antenna tuning elements disposed on either side of the radiating element (36) and connected to the ground plane (39a) of the PCB (39). The lead wire elements (35) are sized, shaped and arranged for purposes of controlling antenna impedance, increasing antenna bandwidth, control antenna radiation patterns, etc. In the exemplary embodiment of FIGS. 3A/3B, the antenna structure with radiating element (36) and tuning elements (35) is formed in conjunction with the board-level ground plane (39a) formed on the PCB (39), where the radiating element (36) is open-ended with respect to the ground plane (39a) and the tuning elements (35) having terminating ends that are short-circuited to the ground plane (39a) (or ground pads/contacts). Again, depending on the application, the lead wires that form an antenna structure can be terminated on the board-level with an open or short circuit to provide required boundary conditions. Antenna structures according to other exemplary embodiments of the invention which utilize board-level ground structures will be discussed below with reference to the exemplary embodiment depicted in FIGS. 6A, 7A, 8A, 9A and 10A, for example.

According to further embodiments of the invention, integrated chip-to-antenna connections are realized in an impedance-controlled fashion by feed networks that are constructed with bond wires and on-chip feed structures to provide a desired antenna input impedance. For example, antenna feed networks according to exemplary embodiments of the invention include on-chip feed structures, such as CPW (coplanar wave guide), differential feed lines, etc, which are formed as part of BEOL metallization of an IC chip, and bond wires to connect the on-chip feed structures to lead wire antenna elements. Integrated antenna systems having on chip feed structures that are formed from on-chip feed structures and bond wires according to exemplary embodiments of the invention will be discussed below with reference to the exemplary embodiments depicted in FIGS. 6A, 7A, 8A, 9A and 10A, for example.

Figure 4B:
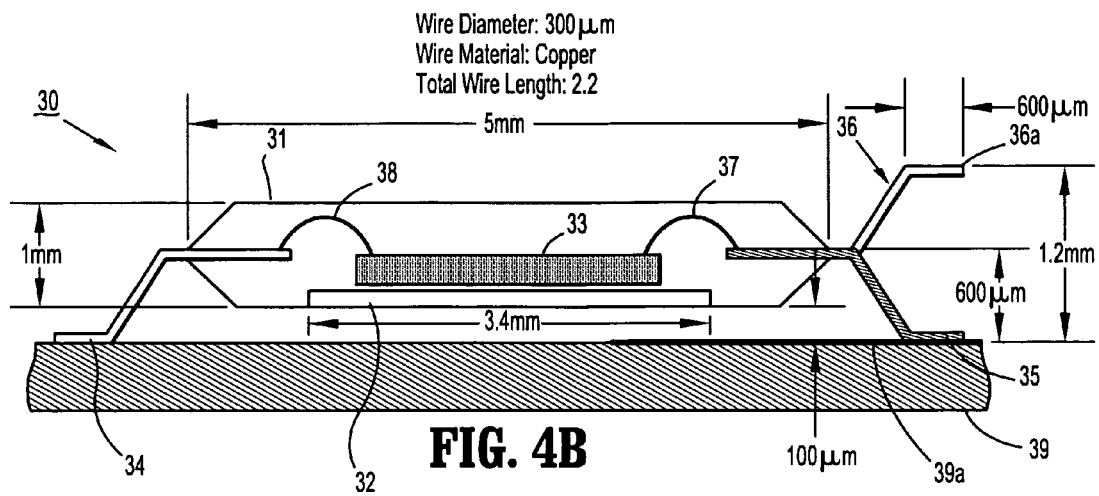
FIGS. 4A and 4B depict exemplary layout and structural dimensions for the exemplary package structure of FIGS. 3A and 3B to form an integrated radio communication system operating at a frequency of about 60 GHz.
Figure 4A:
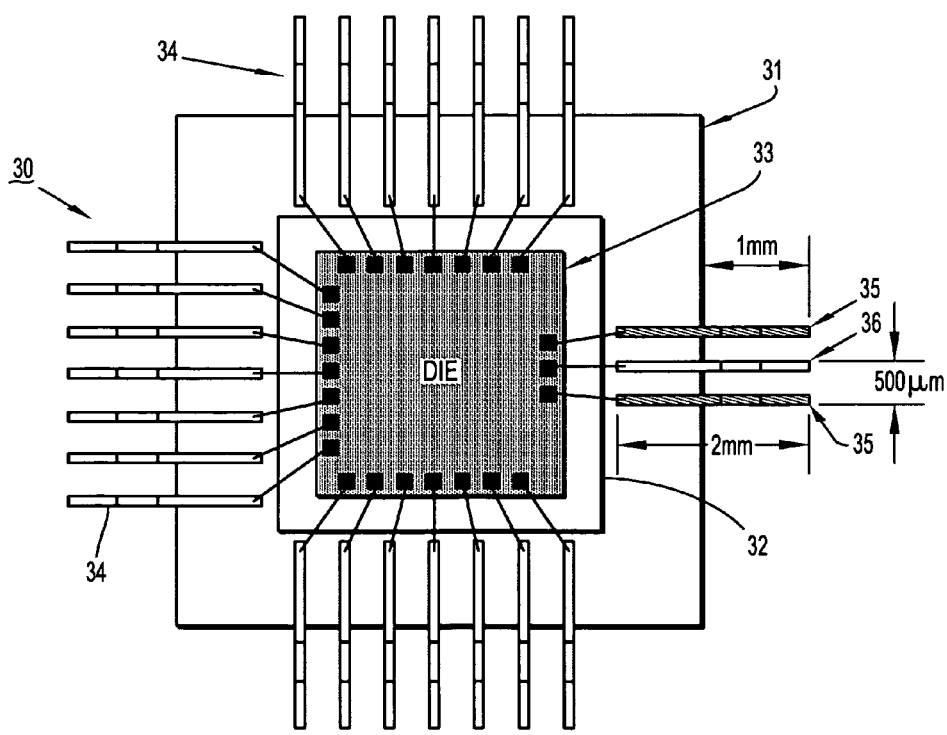

FIGS. 4A and 4B illustrate dimensions of the electronic package apparatus (30) depicted in FIGS. 3A and 3B, for constructing an integrated radio communications system that operates at a fundamental frequency of about 60 GHz. In the exemplary embodiment, the package mold (31) is depicted as having a thickness of 1 mm, a length of 5 mm, and a package offset of 100 microns. The package mold (31) can be formed of a material (plastic, epoxy) preferably having a relatively low dielectric constant and relatively low dielectric loss. The lead wire elements (34), (35) and (36) are formed of copper (or other suitable metallic material) and have a width of 300 microns, while the width of the bond wire (37) is 50 microns. The ground plane (39a) formed on the surface of the PCB (39) is disposed below the antenna lead wire elements (35) and (36). The overall length of the lead wire elements (35) and (36) is 2.2 mm and are separated by a pitch of 500 microns. The length of an upper bent portion (36a) of the element (36), which has an exemplary length of 600 microns, affects the resonant frequency. The 1.2 mm spacing between the upper bent portion (36a) and the ground plane (39a) affects the bandwidth of the antenna. The antenna lead wire elements (35), (36) are connected to an antenna feed network formed by bond wires (37) and an on-chip feed structure (e.g., CPW) on the active surface of the chip (33).

FIGS. 5A and 5B schematically illustrate an antenna feed structure according to an exemplary embodiment of the invention. In particular, FIGS. 5A and 5B illustrate coplanar waveguide (CPW) structure for implementing an unbalanced feed network for feeding antenna structures formed with package lead wires, according to an exemplary embodiment of the invention. FIG. 5A is a plan view of a CPW feed (50) structure which comprises a center conductor (50a) separated from a pair of ground elements (50b, 50c). The elements (50a, 50b and 50c) of the CPW (50) are coplanar (formed on same plane). The CPW (50) can be formed on-chip as part of an upper metallization layer of a BEOL interconnect structure. FIG. 5B schematically illustrates the CPW feed structure embedded in a center plane region (50') of a dielectric medium (51). The dielectric medium (51) is disposed over a ground plane (59a) of a PCB (59).

Computer simulations were performed for a CPW feed structure having the exemplary structural dimensions shown in FIGS. 5A and 5B to provide a 75 ohm CPW. In the exemplary embodiment of FIG. 5A, the center conductor (50a) was defined having a length of 500 microns and width of 100 microns. The ground elements (50b) and (50c) were defined having similar dimensions length×width of 500 microns×500 microns. The center conductor (50a) was spaced apart from each ground element (50b) and (50c) by 50 microns. In FIG. 5B, the dielectric medium (51) was defined having a thickness of 1 mm and spaced apart from the ground plane (59a) by 100 microns. The CPW feed structure (50) was spaced apart from the ground plane (59a) by a distance of 600 microns. The dielectric medium (51) was defined as being formed of a material with a dielectric constant of 2.7 and loss tangent of 0.04.

It is to be appreciated that a CPW structure, such as depicted in FIG. 5A, together with wire bonds, can be used to form antenna feed networks for unbalanced feeding of antennas that are formed from lead wire elements. For instance, various antenna systems designed with open-ended and grounded lead wire antenna elements fed by CPW feed networks, will be discussed with reference to the exemplary embodiments of FIGS. 6A, 7A, 8A and 9A. For purposes of determining electrical performance, properties and characteristics of the exemplary CPW fed antenna structures of FIGS. 6A, 7A, 8A and 9A, computer simulations were performed based on exemplary dimensions of the antenna elements and feed structures depicted in FIGS. 6A, 7A, 8A and 9A for a fundamental operating frequency of about 60 GHz. The results of the computer simulations will be discussed below with reference to FIGS. 6B, 6C, 7B, 8B and 9B. For each of the computer simulations, the antenna CPW feed structures in FIGS. 6A, 7A, 8A and 9A were assumed to be embedded in a dielectric medium and spaced from a ground plane as per the exemplary dimensions and dielectric characteristics as discussed with reference to FIG. 5B.

FIG. 6A schematically illustrates an integrated antenna system according to an exemplary embodiment of the invention. In particular, FIG. 6A illustrates an antenna feed network (60) comprising a CPW structure (61) and wire bond (62), which feeds an antenna structure comprising a radiating element (65). In the exemplary embodiment, the radiating element (65) is a straight, open-ended package lead wire that is disposed parallel to and separated from a ground plane (64). The CPW structure (61) comprises a center conductor (61a) and adjacent ground elements (61b) and (61c). The wire bond (62) provides an electrical connection between the center conductor (61a) of the CPW (60) and one end (fed end) of the lead wire radiating element (65). The antenna feed network (60) and fed end of the radiating element (65) are embedded within a dielectric medium (63).

FIG. 6A illustrates exemplary layout and structural dimensions that were defined for computer simulation of the antenna system of FIG. 6A for an operating frequency of about 60 GHz. In FIG. 6A, the antenna element (65) was defined having a length of 2050 microns. In the exemplary embodiment, the length L1, which includes the wire bond (62) and a portion of element (65) (embedded in the dielectric (63)) is selected to be about one-quarter wavelength of the operating frequency, and the length L2 is selected to be about one-half wavelength of the operating frequency. The elements of the CPW structure (61) were defined to have the same planar dimensions as discussed with reference to FIG. 5A, with the CPW structure (61) being disposed from side of the dielectric medium (63) by 1500 microns. The dielectric medium (63) was defined having that thickness and spacing dimensions as depicted in FIG. 5B.

Figure 6B:
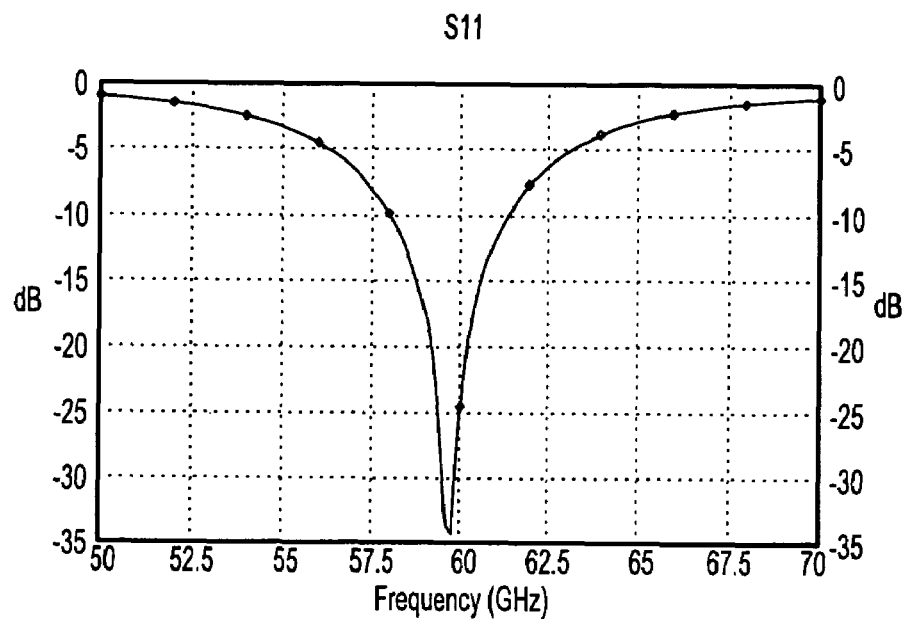
FIG. 6B graphically illustrates a simulated return loss of the antenna structure of FIG. 6A.
Figure 6C:
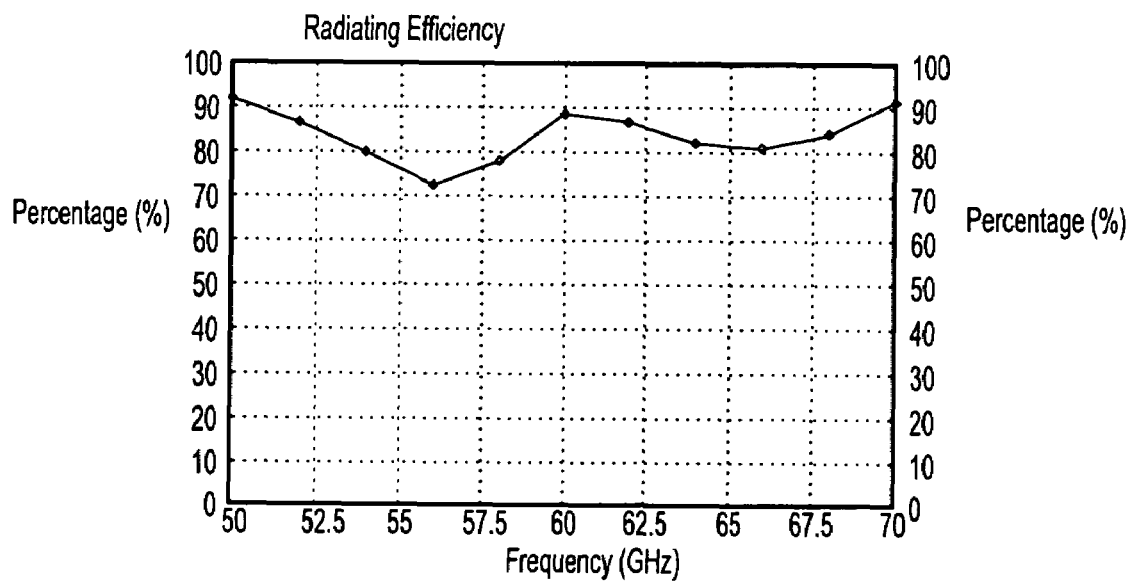
FIG. 6C graphically illustrates a simulated radiating efficiency of the exemplary antenna system of FIG. 6A.

FIGS. 6B and 6C illustrate simulation results for the exemplary antenna system of FIG. 6A. In particular, FIG. 6B graphically illustrates a simulated return loss of the antenna structure normalized to 31 Ohms and, in particular, the simulated return loss (S11) in dB for a frequency range of 50-70 GHz. The simulation results in FIG. 6B illustrate a bandwidth of at least 4 GHz, wherein bandwidth is defined based on the frequency range for which $S_{11}$ was measured to be about −10 dB or better. FIG. 6C graphically illustrates a simulated radiating efficiency of the exemplary antenna system of FIG. 6A over the frequency range of 50~70 GHz. The results of the simulation illustrate a radiation efficiency of 80% or better over the frequency range of 59-64 GHz.

Figure 7A:
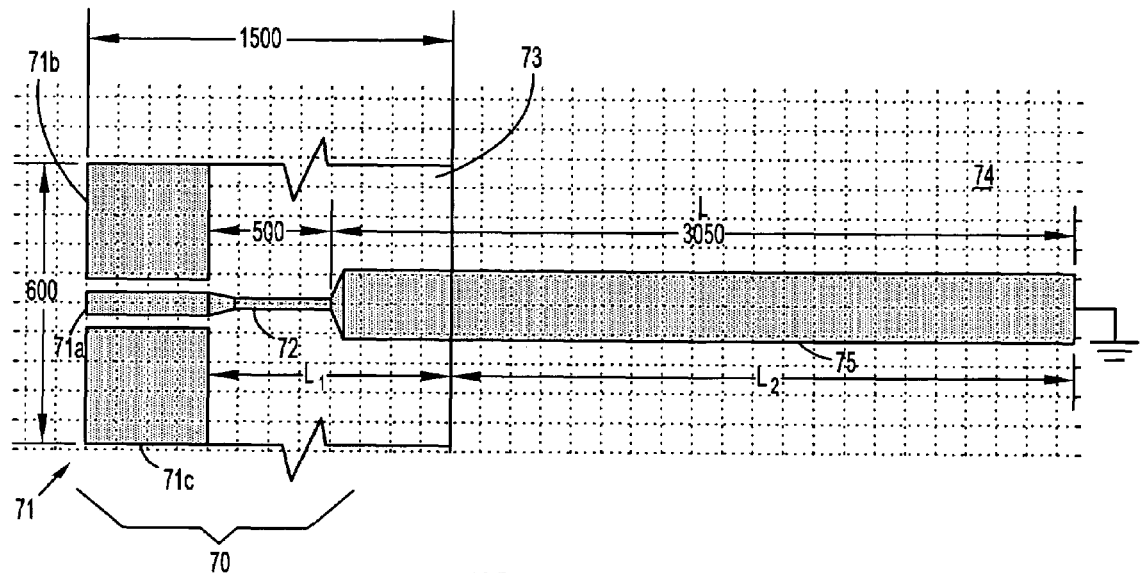
FIG. 7A schematically illustrates an integrated antenna system according to an exemplary embodiment of the invention.

FIG. 7A schematically illustrates an integrated antenna system according to another exemplary embodiment of the invention. In particular, FIG. 7A illustrates an antenna feed network (70) comprising a CPW structure (71) and wire bond (72), which feeds an antenna comprising radiating element (75). In the exemplary embodiment, the radiating element (75) is a grounded lead wire having a straight portion of length L disposed parallel to and separated from a ground plane (74), and an unfed (terminating) end that is bent toward and connected to the ground plane (74). The CPW structure (71) comprises a center conductor (71a) and adjacent ground elements (71b) and (71c). The wire bond (72) provides an electrical connection between the center conductor (71a) of the CPW (70) and one end of the lead wire radiating element (75). The antenna feed network (70) and fed end portion of the radiating element (75) are embedded within a dielectric medium (73). Unlike the antenna structure in FIG. 6A, where the radiation pattern has only one horizontal polarization, the antenna in FIG. 7A has both horizontal and vertical polarizations.

FIG. 7A illustrates exemplary layout and structure dimensions that were defined for computer simulation of the antenna system of FIG. 7A for an operating frequency of about 60 GHz. In FIG. 7A, the antenna element (75) was defined having a length L of 3050 microns. In the exemplary embodiment, the length L1, which includes the wire bond (72) and a portion of element (75) (embedded in the dielectric (73)) is selected to be about one-quarter wavelength of the operating frequency, and the length L2 is selected to be about three-quarters wavelength of the operating frequency. The CPW structure (71) was defined being disposed from side of the dielectric structure (73) by 1500 microns, but having a narrower dimension of 600 microns (as compared to the 1200 microns of the CPW structure (60) of FIG. 6A). The dielectric medium (73) was defined having the exemplary thickness and spacing dimensions as depicted in FIG. 5B.

Figure 7B:
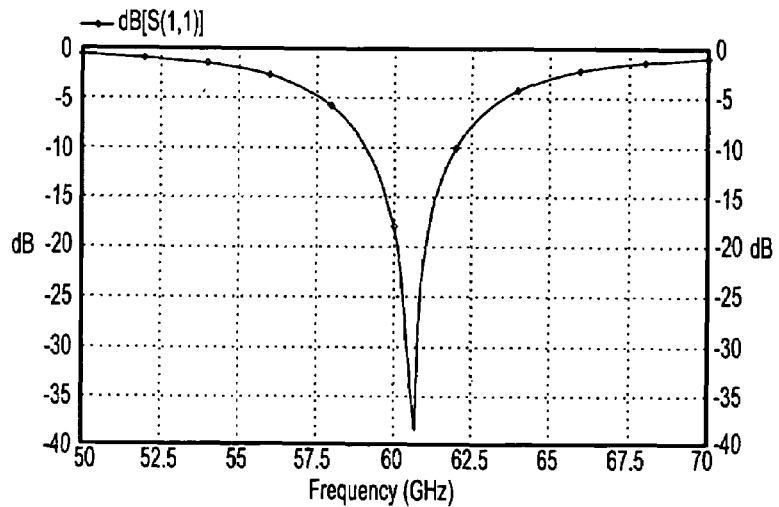
FIG. 7B graphically illustrates a simulated return loss of the antenna structure of FIG. 7A.

FIG. 7B illustrates the simulation results for the exemplary antenna system of FIG. 7A. In particular, FIG. 7B graphically illustrates a simulated return loss of the antenna structure normalized to 37 Ohms and, in particular, the simulated return loss (S11) in dB for a frequency range of 50-70 GHz. The simulation results in FIG. 7B illustrate a bandwidth of at least 2.5 GHz, wherein bandwidth is defined based on the frequency range for which $S_{11}$ was measured to be about −10 dB or better.

Figure 8A:
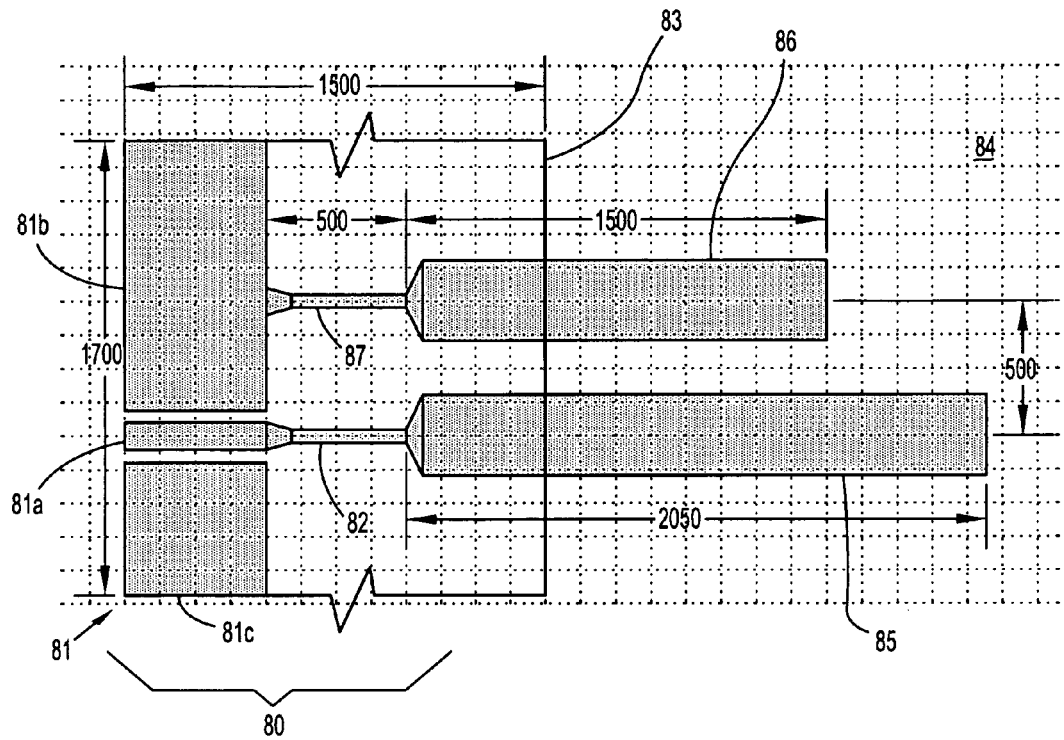
FIG. 8A schematically illustrates an integrated antenna system according to an exemplary embodiment of the invention.

FIG. 8A schematically illustrates an integrated antenna system according to another exemplary embodiment of the invention. In particular, FIG. 8A illustrates an antenna feed network (80) comprising a CPW structure (81) and wire bonds (82) and (87), which feeds an antenna structure comprising a radiating element (85) and a tuning element (86) formed from package leads. The CPW structure (81) comprises a center conductor (81a) and adjacent ground elements (81b) and (81c). The wire bond (82) provides an electrical connection between the center conductor (81a) of the CPW (80) and one end of the radiating element (85). The wire bond (87) provides an electrical connection between the ground element (81b) of the CPW (80) and the tuning element (86). The antenna feed network (80) and fed ends of the radiating and tuning elements (85) and (86) are embedded within a dielectric medium (83).

In the exemplary embodiment of FIG. 8A, the radiating element (85) is an open-ended, straight package lead wire that is disposed parallel to and separated from a ground plane (84). Moreover, the tuning element (86) is an open-ended straight package lead wire that extends parallel to, and spaced apart from, both the ground plane (84) and the antenna radiating element (85). As compared to the antenna system of FIG. 6A, the antenna system of FIG. 8A includes the tuning element (86) disposed in proximity to the radiating element (85) as a means to adjust the antenna resonate frequency and impedance due to the EM coupling between the antenna elements (85) and (86).

FIG. 8A illustrates exemplary layout and structure dimensions that were defined for computer simulation of the antenna system of FIG. 8A for an operating frequency of about 60 GHz. In FIG. 8A, the antenna radiating element (85) was defined having a length of 2050 microns and the antenna tuning element (86) was defined having a length of 1500 microns. Moreover, the dimensions of the ground elements (81b) and (81c) of the CPW structure (81) were dissimilar, with the ground element (81b) connected to the tuning antenna element (86) being wider than the ground element (81c). The dielectric medium (83) was defined having the exemplary thickness and spacing dimensions as depicted in FIG. 5B.

Figure 8B:
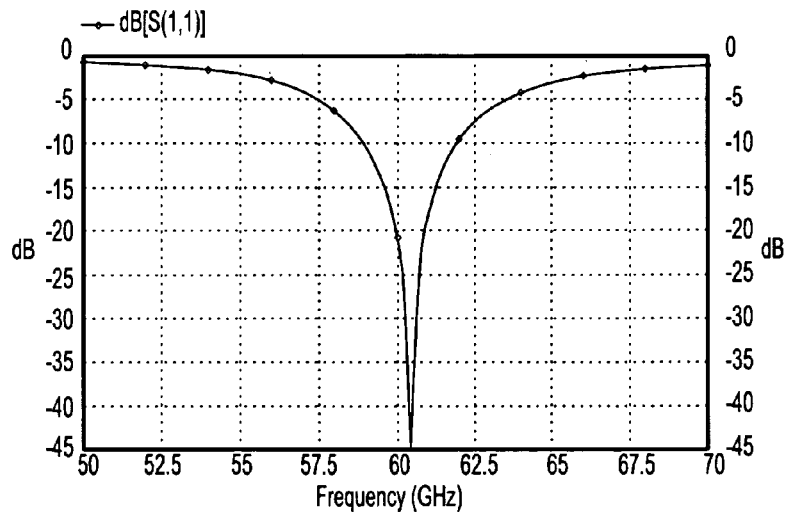
FIG. 8B graphically illustrates a simulated return loss of the antenna structure of FIG. 8A.

FIG. 8B illustrates the simulation results for the exemplary antenna system of FIG. 8A. In particular, FIG. 8B graphically illustrates a simulated return loss of the antenna structure normalized to 31 Ohms and, in particular, the simulated return loss (S11) in dB for a frequency range of 50~70 GHz. The simulation results in FIG. 8B illustrate a bandwidth of at least 4 GHz, wherein bandwidth is defined based on the frequency range for which $S_{11}$ was measured to be about −10 dB or better. Comparing the simulation results depicted in FIGS. 6B and 8B, it is shown that the additional lead wire tuning element (86) proximately disposed to the radiating element (85) results in a shift in the antenna resonate frequency and impedance.

Figure 9A:
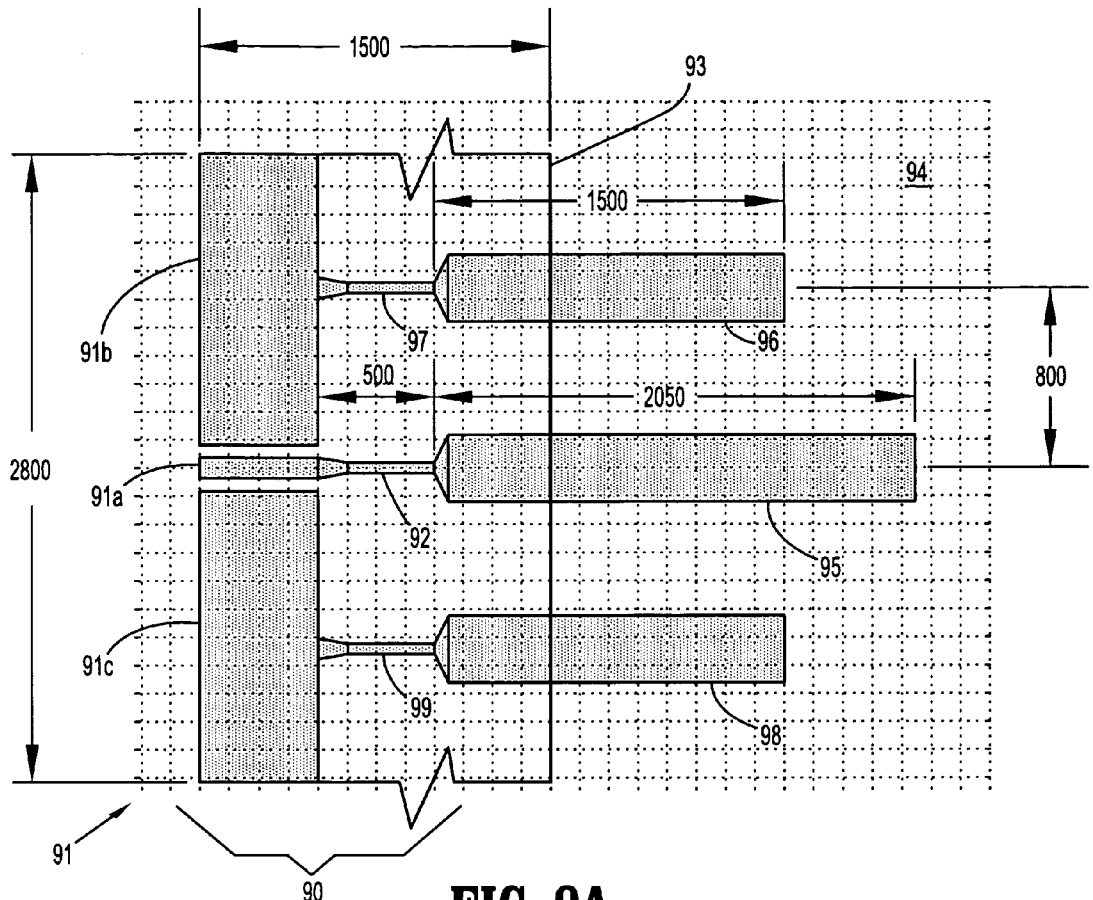
FIG. 9A schematically illustrates an integrated antenna system according to an exemplary embodiment of the invention.

FIG. 9A schematically illustrates an integrated antenna system according to another exemplary embodiment of the invention. In particular, FIG. 9A illustrates an antenna feed network (90) comprising a CPW structure (91) and wire bonds (92), (97) and (99), which feeds an antenna structure comprising a radiating element (95) and tuning elements (96) and (98) formed by package lead wires. The CPW structure (91) comprises a center conductor (91a) and adjacent ground elements (91b) and (91c). The wire bond (92) provides an electrical connection between the center conductor (91a) of the CPW (91) and one end of the radiating element (95). The wire bond (97) provides an electrical connection between the ground element (91b) of the CPW (91) and the antenna tuning element (96). The wire bond (99) provides an electrical connection between the ground element (91c) of the CPW (91) and the antenna tuning element (98). The antenna feed network (90) and fed ends of the radiating and tuning elements (95), (96) and (98) are embedded within a dielectric medium (93).

In the exemplary embodiment of FIG. 9A, the radiating element (95) is formed from an open-ended, straight lead wire that is disposed parallel to and separated from a ground plane (94). Moreover, the tuning elements (96) and (98) are formed from open-ended straight lead wires that extend parallel to the ground plane (94) and on opposite sides of the antenna radiating element (95). As compared to the antenna system of FIG. 8A, the antenna system of FIG. 9A includes a plurality of tuning elements (96) and (98) disposed in proximity to, and on opposite sides of, the radiating element (95) as a means to adjust the antenna resonate frequency and impedance due to the EM coupling between the antenna elements (95) and (96) and (98).

FIG. 9A illustrates exemplary layout and structure dimensions that were defined for computer simulation of the antenna system of FIG. 9A for an operating frequency of about 60 GHz. In FIG. 9A, the antenna element (95) was defined having a length of 2050 microns and the antenna tuning elements (96) and (98) were defined having a length of 1500 microns. Moreover, the dimensions of the ground elements (91b) and (91c) of the CPW structure (91) were similarly defined. The dielectric medium (93) was defined having the exemplary thickness and spacing dimensions as depicted in FIG. 5B.

Figure 9B:
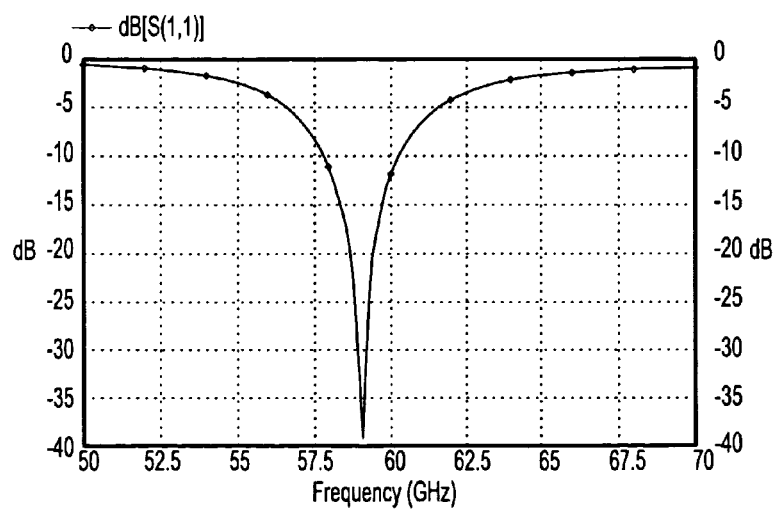
FIG. 9B graphically illustrates a simulated return loss of the antenna structure of FIG. 9A.

FIG. 9B illustrates the simulation results for the exemplary antenna system of FIG. 9A. In particular, FIG. 9B graphically illustrates a simulated return loss of the antenna structure normalized to 31 Ohms and, in particular, the simulated return loss (S11) in dB for a frequency range of 50-70 GHz. The simulation results in FIG. 8B illustrate a bandwidth of at least 2.5 GHz, wherein bandwidth is defined based on the frequency range for which $S_{11}$ was measured to be about −10 dB or better. Comparing the simulation results depicted in FIGS. 6B, 8B and 9B, it is shown that the additional lead wire element (99) proximately disposed to the radiating element (92) results in a shift in the antenna resonate frequency and impedance.

Figure 10A:
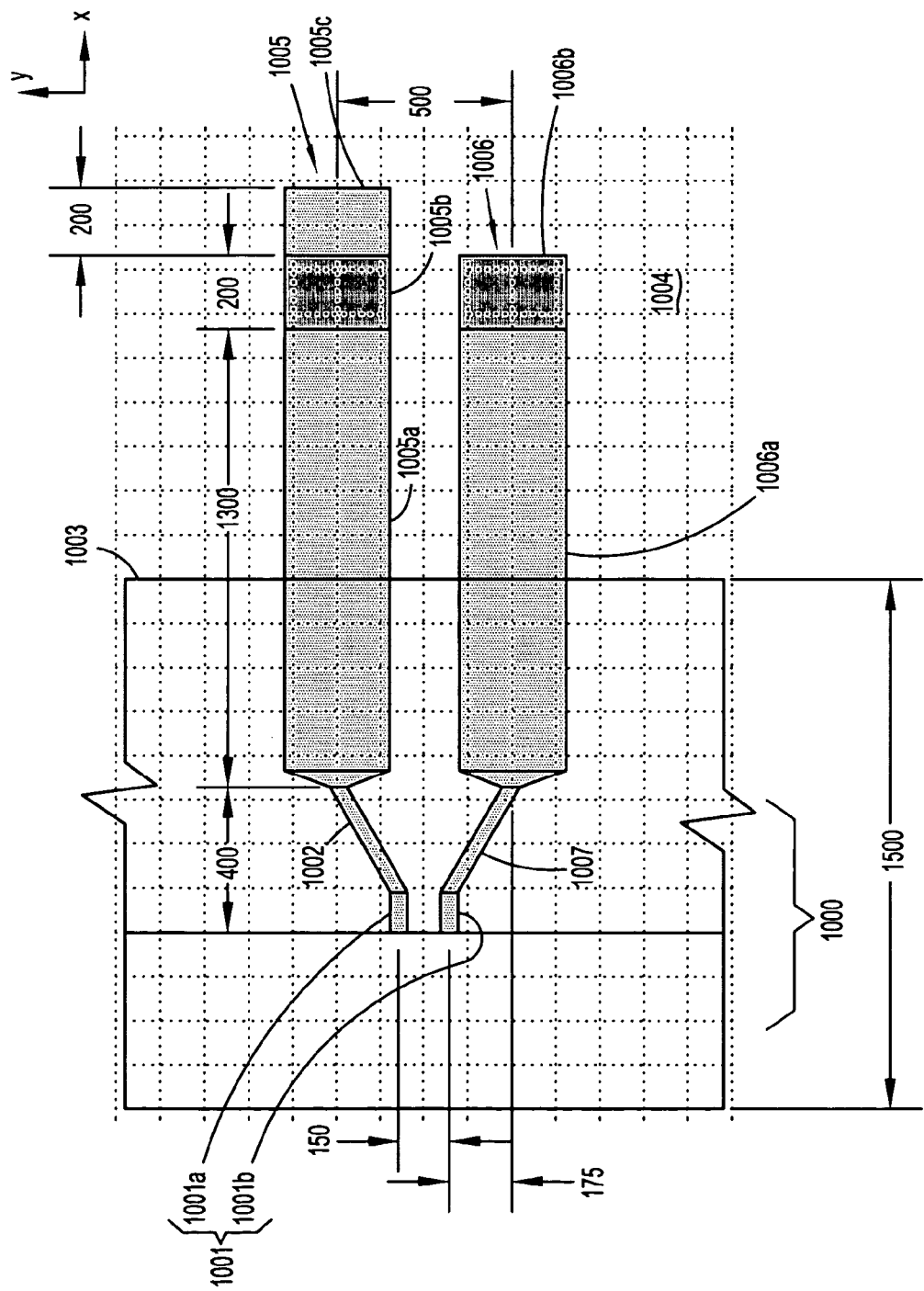
FIGS. 10A and 10B schematically illustrate an integrated antenna system according to an exemplary embodiment of the invention.
Figure 10B:
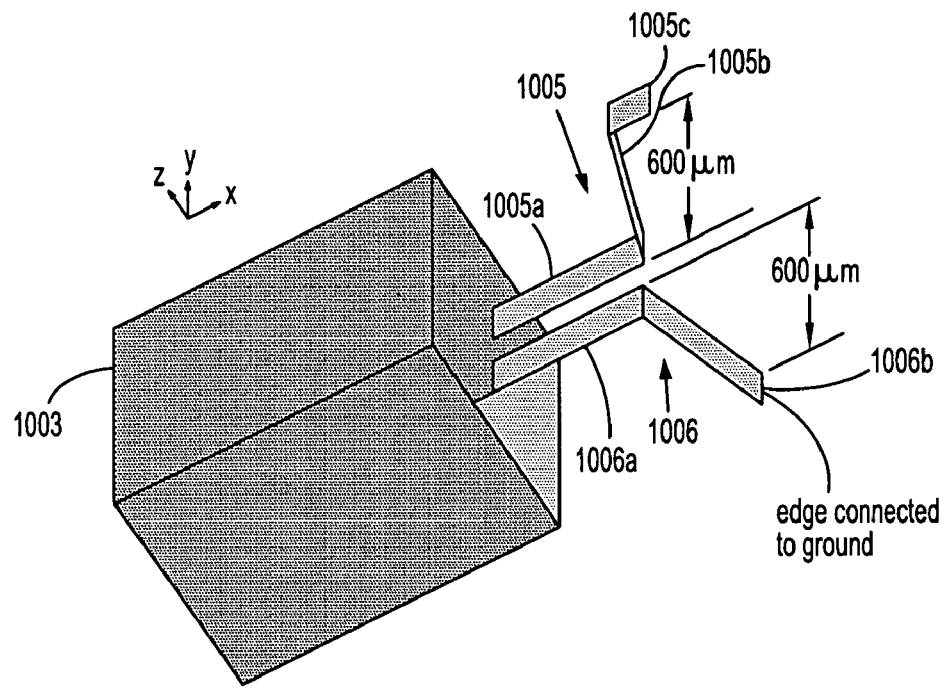

FIGS. 10A and 10B schematically illustrate an integrated antenna system according to another exemplary embodiment of the invention. In particular, FIG. 10A illustrates an antenna feed network (1000) comprising a balanced differential feed lines (1001) and wire bonds (1002) and (1007), which feeds an antenna structure comprising a radiating element (1005) and a tuning element (1006) formed from package leads. The differential feed structure (1001) comprises two coplanar feed lines (1001a) and (1001b). The wire bond (1002) provides an electrical connection between differential line (1001a) and one end of the radiating element (1005). The wire bond (1007) provides an electrical connection between the differential line (1001b) and the tuning element (1006). The antenna feed network (1000) and fed ends of the radiating and tuning elements (1005) and (1006) are embedded within a dielectric medium (1003).

FIG. 10B is a perspective view of the exemplary antenna system of FIG. 10A. In the exemplary embodiment of FIG. 10B, the radiating element (1005) is an open-ended, package lead wire that is shaped as an inverted gull wing lead having a straight portion (1005a), and bent portions (1005b) and (1005c). Moreover, the tuning element (1006) is an close-ended package lead wire having a straight portion (1006a) which extends parallel to, and spaced apart from, both the ground plane (1004) and the portion (1005a) of the radiating element (1005). In addition, the tuning element (1006) has a bent portion (1006b) which extends down from the end of the straight portion (1006a) towards the ground plane (1004) and contacts the ground plane (1004).

FIGS. 10A and 10B illustrate exemplary layout and structure dimensions that were defined for computer simulation of the antenna system for an operating frequency of about 60 GHz. In FIG. 10A, the antenna radiating element (1005) was defined having a length (in the x direction) of 1300+200+200 microns and the antenna tuning element (1006) was defined having a length (in the x direction) of 1300+200 microns. Moreover, the balanced feed lines (1001a, 1001b) are separated by a pitch of 150 microns (where the pitch can be modified to tune the feed line impedance). An exemplary offset distance was defined to be 175 microns. This offset distance can be varied to adjust a separation between (1005) and (1006) to thereby tweak the antenna performance. An exemplary length of 400 microns was defined between the wirebonds (1002) and (1007) in the "x" direction between feedline (1001) and lead wires (1005, 1006) (which length can be varied to change the antenna resonant frequency.) The dielectric medium (1003) was defined having the exemplary thickness and spacing dimensions as depicted in FIG. 5B.

Figure 10C:
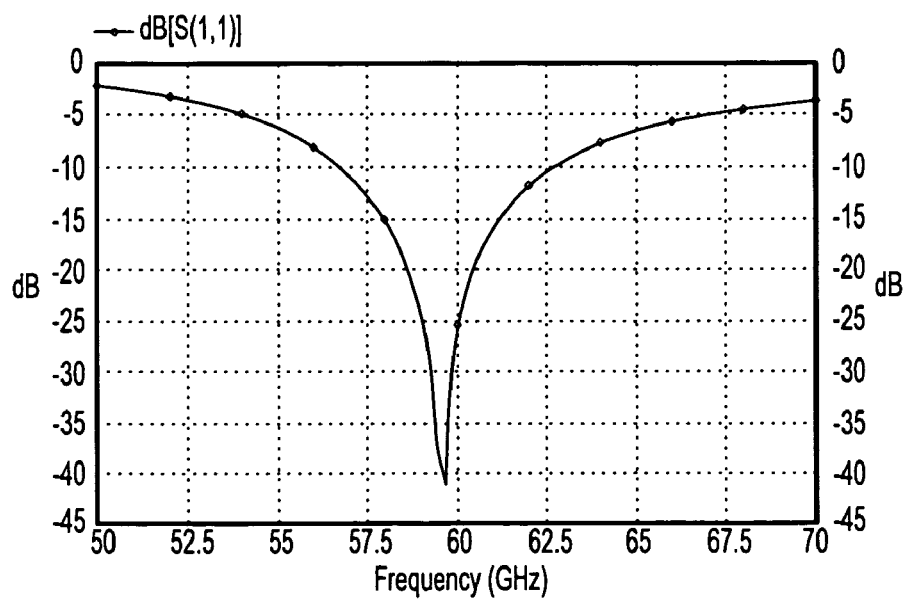
FIG. 10C graphically illustrates a simulated return loss of the antenna structure of FIGS. 10A–B.

FIG. 10C illustrates the simulation results for the exemplary antenna system of FIGS. 10A and 10B. In particular, FIG. 10C graphically illustrates a simulated return loss of the differential fed antenna structure normalized to 150 Ohms and, in particular, the simulated return loss (S11) in dB for a frequency range of 50~70 GHz. The simulation results in FIG. 10C illustrate a bandwidth of at least 6 GHz, wherein bandwidth is defined based on the frequency range for which $S_{11}$ was measured to be about −10 dB or better. Comparing the simulation results depicted in FIGS. 6B, 7B, 8B, 9B and 10C, it is shown that the differential fed antenna structure provides a relatively wider operating bandwidth mainly due to the relatively large separation between the radiating element (1005) and the ground plane (1004).

In another exemplary embodiment of the invention, the antenna framework of FIGS. 10A and 10B can be modified such that element (1006) is not grounded, but rather the elements (1005) and (1006) are formed into a balanced antenna structure such as a dipole antenna fed by the balanced differential line. For example, the leads (1005) and (1006) can be bent away from each other in opposite directions in the y direction to form a half-wavelength dipole radiator.

The integrated antenna systems discussed above are merely exemplary embodiments to illustrate the use of package lead wires to form antenna structures. Based on the teachings herein, one of ordinary skill in the art can readily envision other embodiments in which one or more lead wires can be formed to operate as antenna radiating elements to form antenna structures including, for example, antenna arrays and multiband antenna structures and wherein one or more package lead wires are formed to operate as antenna tuning elements to control antenna impedance, to increase antenna bandwidth or control antenna radiation patterns. The exemplary antenna structures discussed above are meant to illustrate the flexibilities of the antenna design with lead wires, and should not be construed as limiting the scope of the claimed inventions. For instance, in the exemplary embodiments of FIGS. 8A and 9A, the tuning elements can be formed instead as radiating elements having resonant frequencies that enable multi-band operation. By way of specific example, in FIG. 8A, the elements (85) and (86) can be separate radiating elements having resonant frequencies in different frequency bands to provide dual-band operation, and the elements (95), (96) and (98) in FIG. 9A can be separate radiating elements having resonant frequencies in different frequency bands to provide tri-band operation.

Those of ordinary skill in the art will readily appreciate the various advantages associated with antennas and integrated antenna packages according to embodiments of the invention. For instance, exemplary antenna designs which are integrally formed using package lead wires using known techniques enables high-volume antenna manufacturing capability. Moreover, integrated IC packages according to exemplary embodiments of the invention enable antennas to be integrally packaged with IC chips such as transceiver chips, which provide compact designs with very low loss between the transceiver and the antenna. Moreover, the use of integrated antenna/IC chip packages according to the present invention saves significant space, size, cost and weight, which is a premium for virtually any commercial or military application.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

What is claimed is:

1. A wireless communication apparatus, comprising:
 a printed circuit board comprising a metallic ground structure; and
 a chip package mounted to the printed circuit board, the chip package comprising an IC (integrated circuit) chip and antenna system integrally packaged together in a leaded chip-scale package, wherein the antenna system comprises an antenna having a radiating element disposed between two tuning elements, wherein the radiating element and the two tuning elements are formed from respective package lead wires having an overall length of 2.2 millimeters and separated by a pitch of 500 microns, wherein at least a portion of each of the two tuning elements extend substantially parallel to a portion of the radiating element, and the radiating element having a bent portion disposed 1.2 millimeters about the metallic ground structure.

* * * * *